(12) United States Patent
Weigt

(10) Patent No.: US 10,382,058 B2
(45) Date of Patent: Aug. 13, 2019

(54) FAST UPDATE OF DATA PACKET CHECKSUMS

(71) Applicant: DELL PRODUCTS LP, Round Rock, TX (US)

(72) Inventor: George Weigt, Milpitas, CA (US)

(73) Assignee: SONICWALL INC, Milpitas, CA (US)

(*) Notice: Subject to any disclaimer, the term of this patent is extended or adjusted under 35 U.S.C. 154(b) by 0 days.

(21) Appl. No.: 15/640,787

(22) Filed: Jul. 3, 2017

(65) Prior Publication Data

US 2017/0302293 A1    Oct. 19, 2017

Related U.S. Application Data

(63) Continuation of application No. 14/521,035, filed on Oct. 22, 2014, now Pat. No. 9,698,825.

(51) Int. Cl.
| | |
|---|---|
| *H03M 13/09* | (2006.01) |
| *G06F 11/10* | (2006.01) |
| *H04L 1/00* | (2006.01) |
| *H03M 13/07* | (2006.01) |
| *H04L 29/06* | (2006.01) |

(52) U.S. Cl.
CPC ....... *H03M 13/096* (2013.01); *G06F 11/1004* (2013.01); *H03M 13/07* (2013.01); *H03M 13/093* (2013.01); *H04L 1/0061* (2013.01); *H04L 1/0072* (2013.01); *H04L 1/0083* (2013.01); *H04L 69/16* (2013.01); *H04L 69/161* (2013.01)

(58) Field of Classification Search
CPC ............. G06F 11/1004; H03M 13/093; H03M 13/096; H03M 13/07; H04L 1/0061; H04L 1/0072; H04L 1/0083; H04L 69/16; H04L 69/161

USPC ................... 714/807, 766, E11.04
See application file for complete search history.

(56) References Cited

U.S. PATENT DOCUMENTS

| | | | | |
|---|---|---|---|---|
| 5,701,316 A | * | 12/1997 | Alferness | G06F 11/10 711/1 |
| 6,047,304 A | * | 4/2000 | Ladwig | G06F 7/505 708/530 |
| 6,728,930 B2 | * | 4/2004 | Poeluev | H03M 13/07 714/807 |
| 6,964,008 B1 | * | 11/2005 | Van Meter, III | G06F 11/1004 714/766 |
| 7,096,389 B2 | | 8/2006 | Homung et al. | |
| 7,106,735 B2 | * | 9/2006 | Yagyu | H04L 12/1836 370/390 |

(Continued)

OTHER PUBLICATIONS

R. Braden, "Computing the Internet Checksum," Network Working Group Request for Comments: 1071, BBN Laboratories, Sep. 1988, 24 pgs.

T. Mallory, "Incremental Updating of the Internet Cheksum," Network Working Group Request for Comments: 1141, BBN Communications, Jan. 1990, 2 pgs.

(Continued)

*Primary Examiner* — John J Tabone, Jr.
(74) *Attorney, Agent, or Firm* — Polsinelli LLP

(57) ABSTRACT

A device includes a processor and a checksum module, wherein the checksum module calculates, for first data, an updated checksum that complies with Internet Engineering Task Force Request For Comments Number 1624 using twos-complement arithmetic. The processor replaces the original checksum with the updated checksum to update a data packet.

19 Claims, 4 Drawing Sheets

(56) References Cited

U.S. PATENT DOCUMENTS

| | | | |
|---|---|---|---|
| 7,283,542 B2* | 10/2007 | Mitchell | H04L 29/06 370/352 |
| 7,408,932 B2* | 8/2008 | Kounavis | H04L 45/00 370/392 |
| 7,453,874 B1* | 11/2008 | Nguyen | H04L 1/0041 370/389 |
| 7,606,263 B1* | 10/2009 | Parker | H04L 45/745 370/392 |
| 7,890,460 B2 | 2/2011 | Wilmot | |
| 8,806,011 B1* | 8/2014 | Graham-Cumming | H04L 63/1458 709/225 |
| 9,276,848 B1* | 3/2016 | Qian | H04L 1/1607 |
| 9,698,825 B2* | 7/2017 | Weigt | H03M 13/096 |
| 2002/0101872 A1* | 8/2002 | Boivie | H04L 12/18 370/393 |
| 2002/0184598 A1* | 12/2002 | Bace | H03M 13/096 714/807 |
| 2005/0213586 A1* | 9/2005 | Cyganski | H04L 41/0896 370/395.41 |
| 2006/0075119 A1* | 4/2006 | Hussain | H04L 49/90 709/227 |
| 2007/0011560 A1* | 1/2007 | Backman | H04L 1/0061 714/758 |
| 2008/0117911 A1* | 5/2008 | Rajakarunanayake | H04L 47/10 370/392 |
| 2008/0198781 A1* | 8/2008 | Rajakarunanayake | H04L 12/2856 370/310 |
| 2008/0225847 A1* | 9/2008 | Manjunatha | H04L 47/32 370/389 |
| 2012/0304040 A1* | 11/2012 | Bender | G06F 11/1004 714/776 |
| 2013/0166260 A1 | 6/2013 | Fan et al. | |
| 2013/0318357 A1 | 11/2013 | Abrahamm et al. | |
| 2014/0032933 A1* | 1/2014 | Smith | G06F 21/6209 713/193 |
| 2016/0118999 A1* | 4/2016 | Weigt | H03M 13/096 714/807 |
| 2017/0302293 A1* | 10/2017 | Weigt | H03M 13/096 |

OTHER PUBLICATIONS

Rijsinghani, "Computation of the Internet Checksum vai Incremental Update," Network Working Group Request for Comments: 1624, Digital Equipment Corporation, May 1994, 6 pgs.

U.S. Appl. No. 14/521,035 Office Action dated Jul. 28, 2016.

\* cited by examiner

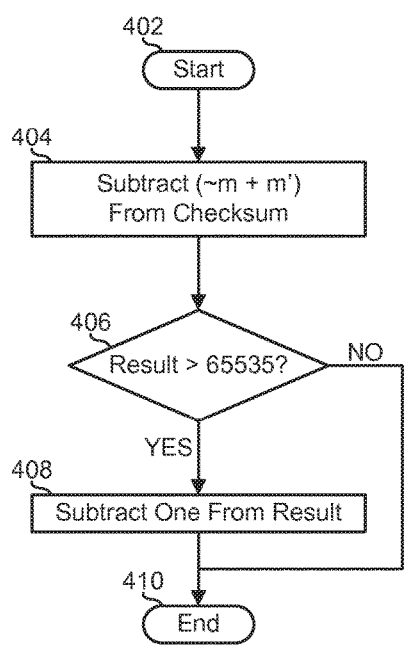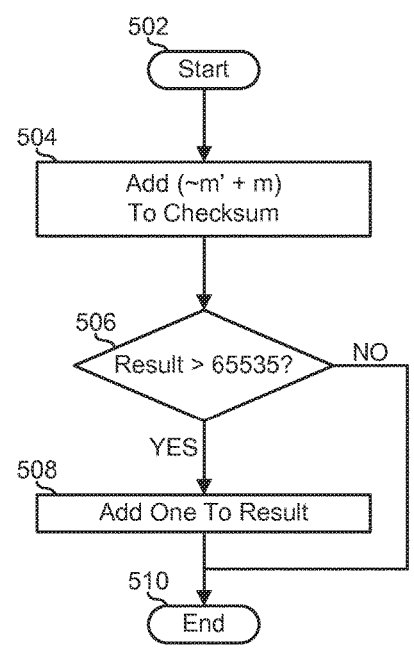
FIG. 4
FIG. 5

FAST UPDATE OF DATA PACKET CHECKSUMS

CROSS-REFERENCE TO RELATED APPLICATIONS

This application is a continuation and claims the priority benefit of U.S. patent application Ser. No. 14/521,035 filed Oct. 22, 2014, now U.S. Pat. No. 9,698,825 the disclosure of which is incorporated herein by reference.

FIELD OF THE DISCLOSURE

This disclosure generally relates to information handling systems, and more particularly relates to fast updates of data packet checksums.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIGS. 4 and 5 illustrate a method of determining IP, TCP, and UDP packet checksum updates according to an embodiment of the present disclosure.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
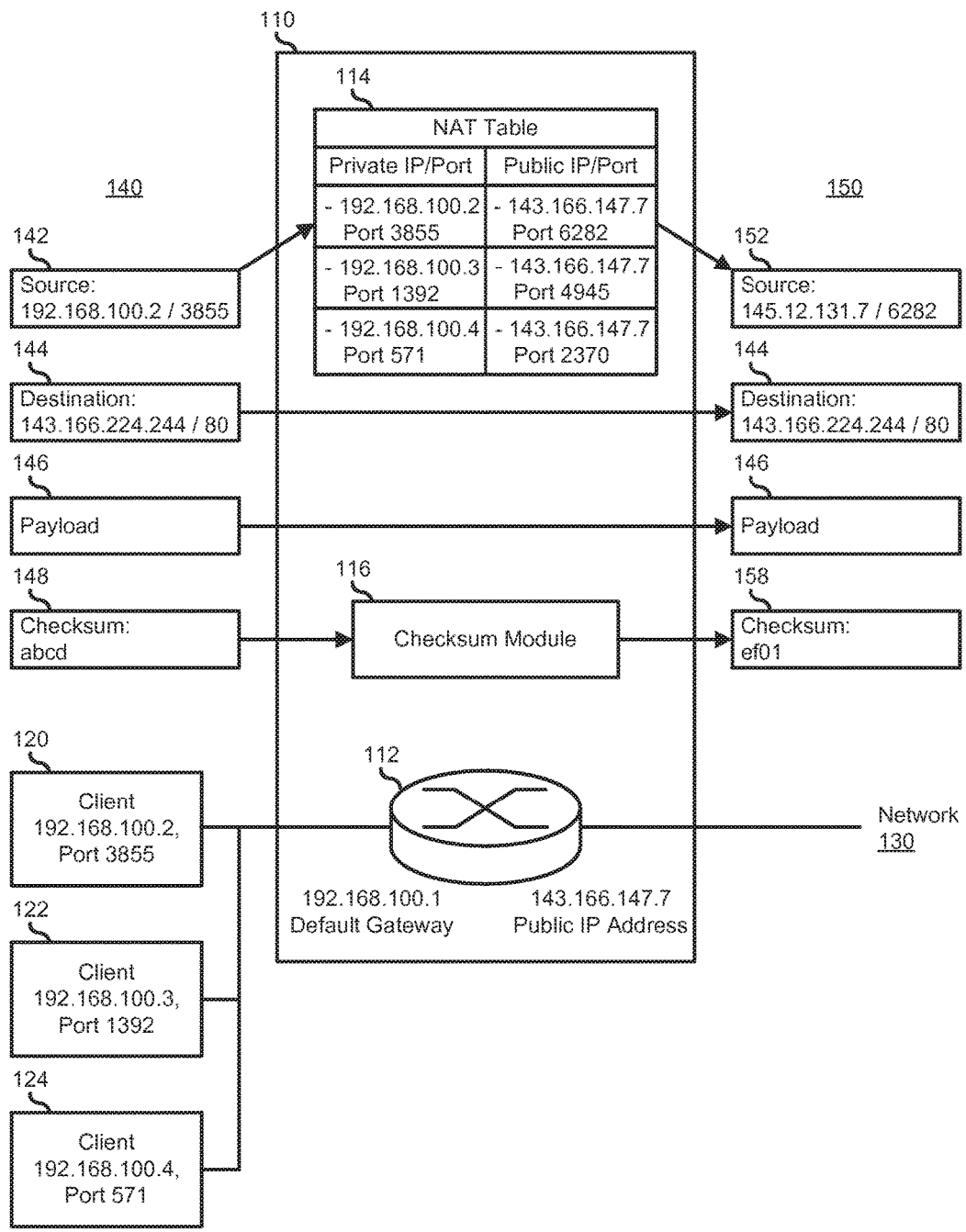
FIG. 1 illustrates a private network according to an embodiment of the present disclosure.

FIG. 1 illustrates an embodiment of a private network 100 which is an example of an information handling system. For the purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Private network 100 includes a Network Address Translation (NAT) router 110 and client systems 120, 122, and 124. NAT router 110 provides Internet Protocol (IP) masquerading to hide the IP address space of client systems 120, 122, and 124 from a public network 130. As such, NAT router 110 sets up a private network with a hidden IP address space that is hidden behind a single IP address in the IP address space of public network 130. For example, public network 130 can represent the Internet, upon which NAT router 110 is identified by a public IP address, such as 143.166.147.7, and the NAT router can establish a private subnet, such as 192.168.100.x, establishing itself as the default gateway for the private subnet, such as 192.168.100.1. Here, clients 120, 122, and 124 are each assigned IP addresses on the private subnet, such as 192.168.100.2 for client 120, 192.168.100.3 for client 122, and 192.168.100.4 for client 124. In a particular embodiment, the IP addresses of clients 120, 122, and 124 are static IP addresses that are provided on the clients and NAT router 110. In another embodiment, the IP addresses of clients 120, 122, and 124 are provided to the clients from NAT router 110 when the clients are connected to the NAT router, such as via a local area network (LAN) or wireless LAN. Here, NAT router 110 can implement the Dynamic Host Configuration Protocol (DHCP) to assign clients 120, 122, and 124 their respective IP addresses when they are connected to the NAT router.

NAT router 110 includes a switch 112, a NAT table 114, and a checksum calculation module (checksum module) 116. In operation, NAT router 110 receives IP packets, translates the information included in a source field and in a port field of the IP packets to new source information and new port information based upon the entries in NAT table 114, calculates a new checksum for the IP packets based upon the new source information and the new port information in checksum module 116, and forwards the IP packets to a destination indicated by a destination field of the IP packets via switch 112. FIG. 1 illustrates a particular example where an IP packet 140 is provided from client 120, is translated by NAT router 110, and a translated IP packet 150 is provided to public network 130, as described below. The skilled artisan will recognize that NAT router 110 will operate similarly when IP packets are received from clients 122 and 124 for forwarding to public network 130, and when IP packets are received from the public network for forwarding to the clients, and as such, specific examples of the operation of the NAT router will not be further described herein.

NAT table 114 includes entries for each of clients 120, 122, and 124, as defined b their respective private IP addresses and assigned private ports. For example, NAT table 114 includes an entry for client 120 that is referenced by the private IP address of the client, that is, 192.168.100.2, and by the private port assigned to the client, that is, port 3855. For each client entry, NAT table 114 includes an associated public IP address, that is, the public IP address of NAT router 110, 143.166.147.7, and an assigned public port, that is, port 6282. When an IP packet is received from the private network, the source information included in a source field of the IP packet, that is, the private IP address and the private port, is replaced with the public source information, that is, the public IP address and the public port. Conversely, when an IP packet is received from the public network, the destination information included in a destination field of the IP packet, that is, the public IP address of NAT router 110 and the public port associated with a particular client 120, 122, or 124, is replaced with the private destination information, that is the private IP address and the private port of the particular client.

However, in both the case of the IP packet received from the private network and the case of the IP packet received from the public network, the translated data packet that is forwarded via switch 112 requires the calculation of an updated checksum. That is, if the original checksum as found in the received IP packet and that is based upon the original source or destination information, is provided on an IP packet that has had a source field or destination field translated, the translated IP packet will be identified as a bad packet because the receiving device will calculate a different checksum based upon the translated source or destination information. Therefore, after translating the source or destination field of received IP packets, checksum module 116 operates to calculate a new checksum based upon the contents of the translated source field or destination field.

In the illustrated example, NAT router 110 receives IP packet 140 from client 120. IP packet 140 includes a source address field 142, a destination address field 144, a data payload 146, and a checksum field 148. Source field 142 includes the IP address and the port information associated with client 120, that is, IP address 192.168.100.2 and port 3855. Destination field 144 includes that IP address and the port information associated with the destination to which the information in data payload 146 is intended to be delivered, such as IP address 143.166.224,244 and port 80. Checksum field 148 includes checksum information for data packet 140 that is determined based upon the information in source field 142, destination field 144, and data payload 146.

NAT router 110 translates IP packet 140 into a new IP packet 150 including new source field 152, destination field 144, data payload 146, and a new checksum field 158, as follows. NAT router 110 determines that IP packet 140 is from client 120 based upon the information in source field 142, indexes into NAT table 114 to determine the public address associated with the client, and provides the public address information from the NAT table to new source field 152. No translation or modification is performed on the contents of destination field 144 or data payload 146, so the destination field and the data payload are provided to IP packet 150.

Checksum module 116 operates to determine a new checksum for data packet 150 and to provide the new checksum in checksum field 158, thereby completing the translation of IP packet 140, and switch 112 routes data packet 150 to the destination in public network 130. In a particular embodiment, checksum module 116 determines the new checksum based upon the contents of new source field 152, destination field 144, and data payload 146. In another embodiment, checksum module 116 determined the new checksum based upon the checksum information from checksum field 148 and the source information from new source field 152, without reference to the information in destination field 144 or data payload 146. Checksum module 116 calculates the checksum information based upon one or more checksum algorithms, as described below. In a particular embodiment, NAT router 110 includes a processor and a memory, and checksum module 116 represents code stored in the memory for performing the one or more checksum algorithms. In another embodiment, checksum module 116 represents a hardware device configured to perform the one or more checksum algorithms, such as an application specific integrated circuit, a programmable logic device, or another hardware device, as needed or desired. The skilled artisan will recognize that for a given IP packet, the payload may include other types of packets such as Transmission Control Protocol (TCP) packets, User Datagram Protocol (UDP) packets, or other packets that may include their own checksum validation. The teachings of the present disclosure are applicable as described below.

In a particular embodiment, checksum module 116 operates to perform updates of checksums for IP packets, TCP packets, and UDP packets in accordance with the Internet Engineering Task Force (IETF) Request For Comments Number 1624 (RFC 1624) which describes a technique for incremental computation of Internet packet checksums using unsigned twos-complement arithmetic. For IP and TCP packets, the checksum update proceeds according to the following pseudo-code:

TABLE-US-00001

Figure 2:
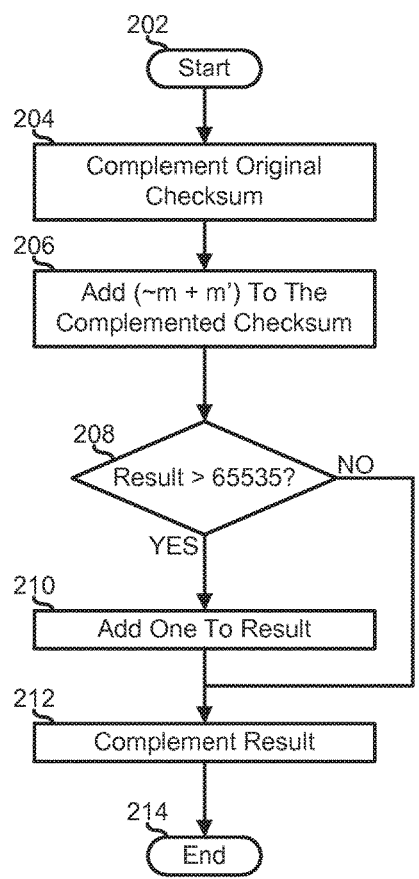
FIGS. 2 and 3 illustrate a method of determining IP, TCP, and UDP packet checksum updates in accordance with ITEF RFC 1624.

// x = original checksum // d = is the difference ((m − m') in 16-bit ones-complement arithmetic) // m = original data // m' = new data //
x1 = new checksum in least significant 16-bits x1 = (x {circumflex over ( )} 0xffff) + d;
if (x1 > 0xffff) x1 = x1 − 0xffff; x1 = x1 {circumflex over ( )} 0xffff;

FIG. 2 illustrates a method of determining IP and TCP packet checksum updates in accordance with ITEF RFC 1624, starting at block 202. In block 204, the checksum information from the packet is complemented. In block 206, the difference in the header information is added to the complemented checksum. Here, in is the original header information and m' is the new header information. The skilled artisan will recognize that, using ones-complement arithmetic, the operation (m–m') is equivalent to the operation (.about.m+m'). A decision is made as to whether or not the result from block 206 is greater than 65,535 (0xffff) in decision block 208. This decision determines whether, for a 16-bit checksum, the operation of block 206 resulted in an overflow. If so, the "YES" branch of decision block 208 is taken, one is added to the result from block 206 in block 210, the result from block 210 is complemented in block 212 to determine the checksum, and the method ends in block 214. If the result from block 206 is not greater than 65,535, the "NO" branch of decision block 208 is taken, the result from block 206 is complemented in block 212 to determine the checksum, and the method ends in block 214.

For UDP packets in which the checksum is not equal to zero, the checksum update proceeds according to the following pseudo-code:

TABLE-US-00002

Figure 3:
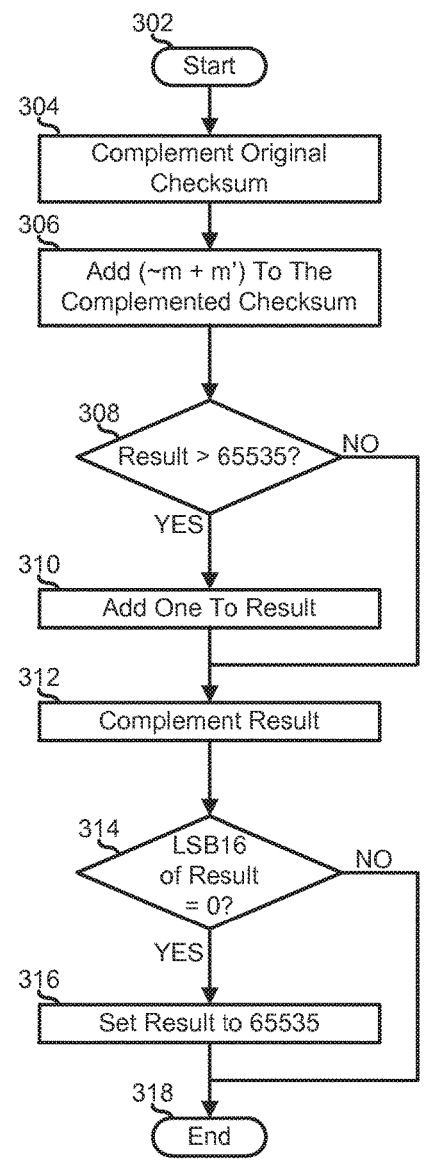

// x =original checksum // d = is the difference
((m – m') in 16-bit ones-
complement arithmetic) // m = original data
// m' = new data //
x1 = new checksum in least
significant 16-bits x1 = (x {circumflex over
( )} 0xffff) + d;
if (x1 > 0xffff) x1 = x1 – 0xffff; x1 = x1
{circumflex over ( )} 0xffff; if (x1 == 0)
x1 = 0xffff;

FIG. 3 illustrates a method of determining UDP packet checksum updates in accordance with ITEF RFC 1624, starting at block 302. In block 304, the checksum information from the packet is complemented. In block 306, the difference in the header information is added to the complemented checksum. A decision is made as to whether or not the result from block 306 is greater than 65,535 (0xffff) in decision block 308. If so, the "YES" branch of decision block 308 is taken, one is added to the result from block 306 in block 210, and the result from block 310 is complemented in block 312. If the result from block 306 is not greater than 65,535, the "NO" branch of decision block 308 is taken and the result from block 306 is complemented in block 312. A decision is made as to whether or not the least significant 16 bits of the result from block 312 is equal to zero in decision block 314. If not, the "NO" branch of decision block 314 is taken, the new checksum is the result from block 312, and the method ends in block 214. If the least significant 16 bits of the result from block 312 is equal to zero, the "YES" branch of decision block 314 is taken, the checksum is set to equal 65535 (0xffff) in block 316, and the method ends in block 318.

In another embodiment, checksum module 116 operates to perform updates of checksums for IP packets, TCP packets, and UDP packets using twos-complement arithmetic. For IP and TCP packets, the checksum update proceeds using unsigned twos-complement arithmetic according to the following pseudo-code:

TABLE-US-00003

// x = original checksum // d = is the
difference ((m – m') in 16-bit ones-
complement arithmetic) // m = original data //
m' = new data // x1 = new checksum in least
significant 16-bits x1 = x – d;
if (x1 > 0xffff) x1 = x1 – 1;

FIG. 4 illustrates a method of determining IP and TCP packet checksum updates in accordance with the present disclosure, starting at block 402. In block 404, the difference in the header information is subtracted from the checksum. A decision is made as to whether or not the result from block 404 is greater than 65,535 (0xffff) in decision block 406. If so, the "YES" branch of decision block 406 is taken, one is subtracted from the result from block 404 to provide the checksum in block 408 and the method ends in block 410. If the result from block 404 is not greater than 65,535, the "NO" branch of decision block 406 is taken, the checksum is the result from block 404, and the method ends in block 410.

For UDP packets in which the checksum is not equal to zero, the checksum update proceeds using unsigned twos-complement arithmetic according to the following pseudo-code:

TABLE-US-00004

// x = original checksum // d = is the difference
((m – m') in 16-bit ones-
complement arithmetic) // m = original data //
m' = new data // x1 = new checksum in least
significant 16-bits x1 = x + d;
if (x1 > 0xffff) x1 = x1 + 1;

FIG. 5 illustrates a method of determining UDP packet checksum updates in accordance with the present disclosure, starting at block 502. In block 504, the difference in the header information is added to the checksum. A decision is made as to whether or not the result from block 504 is greater than 65,535 (0xffff) in decision block 506. If so, the "YES" branch of decision block 506 is taken, one is added to from the result from block 504 to provide the checksum in block 508 and the method ends in block 510. If the result from block 504 is not greater than 65,535, the "NO" branch of decision block 506 is taken, the checksum is the result from block 504, and the method ends in block 510.

In a particular embodiment, the checksum updates as described herein are provided on other types of devices that perform checksum updates, in addition to the embodiment shown for NAT router 110. For example, where a network router, switch, gateway, firewall, intrusion detection system, intrusion prevention system, perimeter network, or other device operates to calculate IP packet checksums, the teachings of the present application can be utilized to provide the checksums, and the illustration of NAT router 110 is provided as an exemplary embodiment of the present disclosure. For example, calculation of the checksum information included in checksum field 148 can be performed in client 120 based upon the teachings of the present application, using the information from source address field 142, destination address field 144, and data 146.

Figure 6:
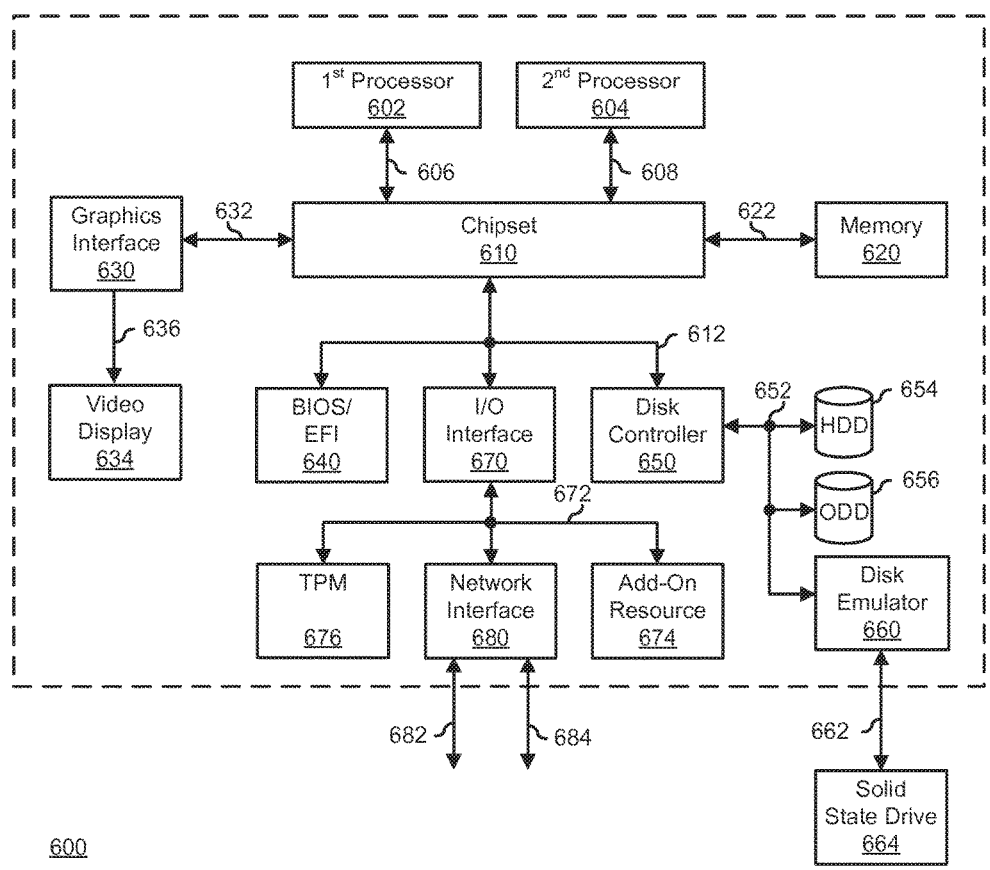
FIG. 6 is a block diagram illustrating a generalized information handling system according to an embodiment of the present disclosure.

FIG. 6 illustrates a generalized embodiment of information handling system 600. For purpose of this disclosure information handling system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described above, and operates to perform one or more of the methods described above. Information handling system 600 includes a. processors 602 and 604, a chipset 610, a memory 620, a graphics interface 630, include a basic input and output system/extensible firmware interface (BIOS/EFI) module 640, a disk controller 650, a disk emulator 660, an input/output (I/O) interface 670, and a network interface 680. Processor 602 is connected to chipset 610 via processor interface 606, and processor 604 is connected to the chipset via processor interface 608. Memory 620 is connected to chipset 610 via a memory bus 622. Graphics interface 630 is connected to chipset 610 via a graphics interface 632, and provides a video display output 636 to a video display 634. In a particular embodiment, information handling system 600 includes separate memories that are dedicated to each of processors 602 and 604 via separate memory interfaces. An example of memory 620 includes random access memory (RAM) such as static RAM (SRAM), dynamic RAM (DRAW non-volatile RAM (NV-RAM), or the like, read only memory (ROM), another type of memory, or a combination thereof.

BIOS/EFI module 640, disk controller 650, and I/O interface 670 are connected to chipset 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 610 can also include one or more other I/O interfaces, including an Industry Standard Architecture (ISA) interface, a Small Computer Serial Interface (SCSI) interface, an Inter-Integrated Circuit (I.sup.2C) interface, a System Packet Interface (SPI), a Universal Serial Bus (USB), another interface, or a combination thereof. BIOS/EFI module 640 includes BIOS/EFI code operable to detect resources within information handling system 600, to provide drivers for the resources, initialize the resources, and access the resources. BIOS/EFI module 640 includes code that operates to detect resources within information handling system 600, to provide drivers for the resources, to initialize the resources, and to access the resources.

Disk controller 650 includes a disk interface 652 that connects the disc controller to a hard disk drive (HDD) 654, to an optical disk drive (ODD) 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits a solid-state drive 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O interface 670 includes a peripheral interface 672 that connects the I/O interface to an add-on resource 674, to a TPM 676, and to network interface 680. Peripheral interface 672 can be the same type of interface as I/O channel 612, or can be a different type of interface. As such, I/O interface 670 extends the capacity of I/O channel 612 when peripheral interface 672 and the I/O channel are of the same type, and the I/O interface translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as chipset 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system for updating data packet checksums, the system comprising:
    a communication interface that receives a data packet via a first port, wherein the received data packet includes first source field information and first port field information; and
    a processor that executes instructions stored in memory, wherein execution of the instructions by the processor:
        identifies second source field information and second port field information for the data packet based on the first source field information and first port field information, the identified second source field information and the second port field information associated with a second port;
        calculates a checksum based on the second source field information and second port field information; and
        updates the received data packet based on the calculated checksum;
    wherein the communication interface forwards the updated data packet to a destination via a second port.

2. The system of claim 1, wherein the updated data packet further includes a destination field identifying an internet protocol (IP) address and a data payload field, the IP address identifying the destination to which data indicated by the data payload field is to be delivered.

3. The system of claim 2, wherein the communication interface further forwards the updated data packet to the destination.

4. The system of claim 2, wherein the checksum is further calculated based on the destination field and the data payload field.

5. The system of claim 1, wherein the checksum is calculated further based on twos-complement arithmetic.

6. The system of claim 5, wherein the twos-complement arithmetic comprises:

$x1 = x-d;$ if $(x1 > 0xffff)$ $x1 = x1-1;\ \&\ 0xffff;$ where x is an original checksum calculated from the first source field information and first port field information, d is a ones-complement difference (m−m') between first data (m') associated with the checksum and second data (m) associated with the original checksum, and wherein x1 is the checksum.

7. The system of claim 1, wherein the received data packet is at least one of an IP data packet, transmission control protocol packet, and a user datagram protocol packet.

8. A method for updating data packet checksums, the method comprising:
    receiving a data packet at a communication interface via a first port, the received data packet including first source field information and first port field information;
    executing instructions stored in memory, wherein execution of the instructions by a processor:
        identifies second source field information and second port field information for the data packet based on the first source field information and first port field information, the identified second source field information and the second port field information associated with via a second port;
        calculates a checksum based on the second source field information and second port field information; and
        updates the received data packet based on the calculated checksum; and
    forwarding the updated data packet to a destination via a second port.

9. The method of claim 8, wherein the updated data packet further includes a destination field identifying an IP address and a data payload field, the IP address identifying the destination to which data indicated by the data payload field is to be delivered.

10. The method of claim 9, wherein the checksum is further calculated based on the destination field and the data payload field.

11. The method of claim 9, wherein the checksum is calculated further based on twos-complement arithmetic.

12. The method of claim 11, wherein the twos-complement arithmetic comprises:

$x1 = x-d;$ if $(x1 > 0xffff)$ $x1 = x1-1;\ \&\ 0xffff;$ where x is an original checksum calculated from the first source field information and first port field information, d is a ones-complement difference (m−m') between first data (m') associated with the checksum and second data (m) associated with the original checksum, and wherein x1 is the checksum.

13. The method of claim 8, wherein the received data packet is at least one of an IP data packet, transmission control protocol packet, and a user datagram protocol packet.

14. A non-transitory computer-readable storage medium, having embodied thereon instructions executable by at least one processor to perform a method for updating data packet checksums, the method comprising:
    receiving a data packet at a communication interface via a first port, the data packet including first source field information and first port field information;
    identifying second source field information and second port field information for the data packet based on the first source field information and first port field information, the identified second source field information and the second port field information associated with a second port;
    calculating a checksum based on the second source field information and second port field information;
    updating the received data packet based on the calculated checksum;
    forwarding the updated data packet to a destination via a second port.

15. The non-transitory computer-readable storage medium of claim 14, wherein the updated data packet further includes a destination field identifying an IP address and a data payload field including data, the IP address identifying the destination to which data indicated by the data payload field is to be delivered.

16. The non-transitory computer-readable storage medium of claim 15, further comprising instructions executable to forward the updated data packet to the destination.

17. The non-transitory computer-readable storage medium of claim 15, wherein the checksum is calculated after the first source field information and second source field information have been determined and the checksum is further calculated based on the destination field and the data payload field.

18. The non-transitory computer-readable storage medium of claim 14, wherein the checksum is calculated further based on twos-complement arithmetic.

19. The non-transitory computer-readable storage medium of claim 18, wherein the twos-complement arithmetic comprises:

$x1 = x - d;$ if $(x1 > 0xffff)$ $x1 = x1 - 1; \text{ \& } 0xffff;$ where x is an original checksum calculated from the first source field information and first port field information, d is a ones-complement difference (m−m') between first data (m') associated with the checksum and second data (m) associated with the original checksum, and wherein x1 is the checksum.

* * * * *